US008882276B2

(12) United States Patent
Nordgård-Hansen et al.

(10) Patent No.: US 8,882,276 B2
(45) Date of Patent: Nov. 11, 2014

(54) VARIABLE PROJECTOR COOLING APPARATUS AND METHOD

(75) Inventors: Ellen Nordgård-Hansen, Gamle Fredrikstad (NO); Freddy Agnalt, Gamle Fredrikstad (NO)

(73) Assignee: Projection Design AS, Gamle Fredrikstad (NO)

( * ) Notice: Subject to any disclaimer, the term of this patent is extended or adjusted under 35 U.S.C. 154(b) by 326 days.

(21) Appl. No.: 13/412,491

(22) Filed: Mar. 5, 2012

(65) Prior Publication Data

US 2013/0229632 A1  Sep. 5, 2013

(51) Int. Cl.
*G03B 21/16* (2006.01)
*H01L 23/34* (2006.01)

(52) U.S. Cl.
CPC ............... *G03B 21/16* (2013.01); *H01L 23/34* (2013.01)
USPC ................ 353/58; 353/60; 353/61; 348/748

(58) Field of Classification Search
CPC ............... G03B 21/16; G05D 23/2028; G05D 23/1932; G06F 1/206; H01L 23/34; F04D 27/00; H04N 9/3144
USPC ................. 353/58, 60, 61; 348/748
See application file for complete search history.

(56) References Cited

U.S. PATENT DOCUMENTS

| 5,860,719 A | 1/1999 | Suzuki et al. |
| 6,398,366 B1 | 6/2002 | Hara et al. |
| 6,481,854 B1 | 11/2002 | Sugawara et al. |
| 2006/0001844 A1 | 1/2006 | Fukuda et al. |
| 2008/0218050 A1 | 9/2008 | Soma et al. |
| 2008/0231812 A1 | 9/2008 | Sakai et al. |
| 2013/0110307 A1 * | 5/2013 | Hensley et al. ............... 700/300 |

* cited by examiner

*Primary Examiner* — Georgia Y Epps
*Assistant Examiner* — Magda Cruz
(74) *Attorney, Agent, or Firm* — Kilpatrick Townsend & Stockton LLP

(57) ABSTRACT

Methods and systems are provided for providing asymmetrical cooling for projectors. The projector can include two light assemblies, with each light assembly including a light source. The light assemblies are arranged horizontally adjacent to each other having both light assemblies facing in a direction of projected light from the light sources. On an outer side opposite the side adjacent to the other light assembly, each light assembly is accompanied by a pair of fans. One fan provides air to a top of the light assembly, and the other fan provides air to a bottom of the light assembly. More cooling air is provided to a top of the light assembly to cool a part of the light source that is hotter than the bottom part of the light source due to natural convection. The fan speeds can be varied based on a temperature measurement (e.g., using calibration tables) and/or based on other inputs.

22 Claims, 10 Drawing Sheets

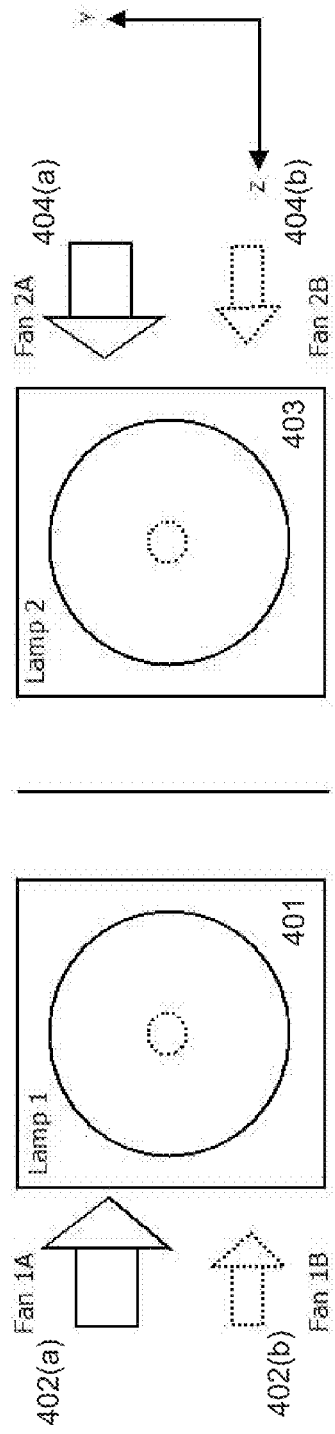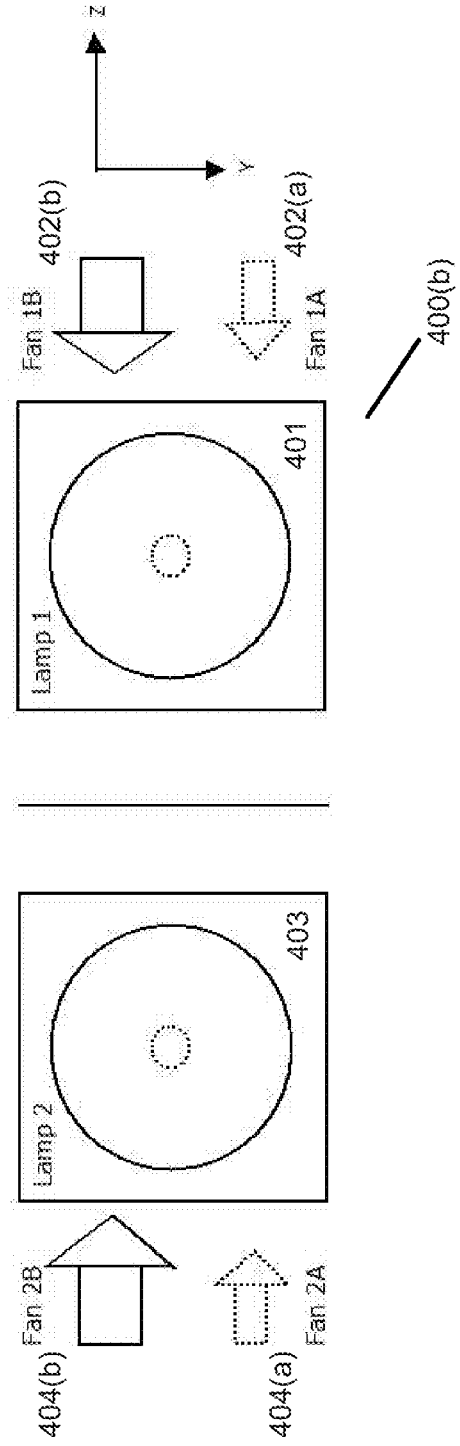

VARIABLE PROJECTOR COOLING APPARATUS AND METHOD

BACKGROUND

Projectors, projector assemblies, and other related devices are often used to provide images using a light source to project an image onto a surface, such as a screen or a wall. There are many different types of projectors used for many different purposes. For example, a video projector intakes a video signal from a device, such as a computer, home theater system, DVD player, etc. to project images from the video signal. Other examples of projectors include movie projectors to project moving pictures from a filmstrip, slide projectors to project still images on film media, or an overhead projector to project still images on a transparent sheet using a reflective base and lens. Images are projected using a light source.

To project images onto a surface such as wall, the light source may comprise a high wattage light bulb to provide enough light to project the image clearly on the wall from a certain distance. High wattage light bulbs not only emit sufficient light to project the image, but also generate a significant amount of heat. The heat generated by the high wattage light bulbs often leads to overheating of the light assembly and the projector, when a maximum threshold temperature is reached. Overheating, and consistent or continued use of the projector at a temperature exceeding the maximum threshold temperature, may cause damage to the light assembly, light bulb, or projector itself. Overheating also limits the amount of use, as a user may need to occasionally shut off the projector to allow it to cool down to an operating temperature before continuing. This may be very disruptive, particularly for video or movie projectors where continuity of the projected images is essential. Thus, a cooling system and method is needed to prevent overheating of the projector to reduce damage, and increase productivity, reliability, and product longevity by providing preferred operating conditions for the lamp assembly of the projector. As a result, maximum light output and maximum lifetime of the lamp are achieved in that light bulbs do not need to be changed as frequently, and the risk of the light bulbs exploding due to high temperatures is reduced.

However, because of natural convection, there may be differences in the temperature of gas inside the light bulb as the gas at the top of the light bulb will be significantly hotter than the gas at the bottom of the light bulb. Thus, providing a single, constant supply of air to the light source of the light assembly in a projector to cool the light bulb is also insufficient, as a temperature difference between the top and the bottom of the light bulb will still occur. Even with a constant supply of air through a fan or other means, hotter gas will still rise to the top of the light bulb, and cooler gas will still remain at the bottom of the light bulb. Air outside the light bulb but within the lamp assembly may be moved quickly past the bulb by the supply of air provided by the fans, thus not being affected strongly by natural convection. The temperature difference between the top and the bottom of the light bulb may also cause damage to the light bulb and reduce its longevity, thus a small temperature difference between the bulb top and bottom needs to be maintained for optimal performance, reliability, and product lifespan. Particularly for high wattage lamps used in projectors, the temperature difference between the top of the light bulb and the bottom of the light bulb should be as small as possible to prevent damage. Therefore, an improved cooling system to provide and maintain a small temperature difference, with minimal temperature variance is needed, and cannot be achieved with conventional cooling systems providing a single, symmetric supply of air.

Additionally, because the applications of projectors may differ, there are multiple configurations and mounting variations for a projector's particular use. For example, an overhead projector or slide projector is typically desktop-mounted so that slides, film, and transparencies may be accessed by a user, whereas a video projector may be desktop-mounted or ceiling-mounted, and connected to a DVD player through a cable. Projectors may also have multiple light assemblies and light sources with different configurations, for example, projectors capable of rotation around the lamp axis. These factors introduce complications in providing cooling solutions to projectors efficiently and universally, without incurring significant changes or costs to accommodate different mounting configurations and/or existing projector systems. Thus, specialized and improved cooling systems and methods are needed.

Embodiments of the invention address these and other problems.

BRIEF SUMMARY

Embodiments of the invention are directed to improved cooling methods and apparatuses for projector assemblies through asymmetric cooling, supplying heavier cooling to the top of a light source of the projector assembly relative to the bottom of the light source. Additionally, multiple light sources can be used in a compact design while still providing asymmetric cooling. The settings of fans that provide asymmetric cooling can also be based on an ambient temperature measurement. Thus, the asymmetric cooling can be tailored to the current environment.

According to one embodiment, a projector includes a first light assembly having a top surface, a bottom surface, a first surface, and a second surface opposite the first surface. The first light assembly includes a first light source. The projector also includes a second light assembly having a top surface, a bottom surface, a first surface, and a second surface opposite the first surface. The second light assembly includes a second light source. The first surface of the first light assembly is adjacent to the second surface of the second light assembly. Each light source (i.e. the first and second light sources) has a top surface and a bottom surface opposite the top surface. The projector also includes a pair of fans for each light source. The first fan of each pair of fans for each light source is aligned with the top surface of the light source for supplying air to the top surface. A first speed of the first fan is variable. The second fan of each pair of fans for each light source is aligned with the bottom surface of the light source element for supplying air to the bottom surface. A second speed of the second fan is variable. A temperature measuring device determines an ambient temperature. Control circuitry adjusts the first speed of the first fan and the second speed of the second fan based on the measured ambient temperature to reduce a temperature difference between the top surface of each light source and bottom surface of each light source.

Other embodiments of the invention relate to a projector assembly comprising: a first light assembly having a top surface, a bottom surface, a first surface, and a second surface opposite the first surface, the first light assembly including a first light source; a second light assembly having a top surface, a bottom surface, a first surface, and a second surface opposite the first surface, the second light assembly including a second light source, wherein the first surface of the first light assembly is adjacent to the second surface of the second light assembly, wherein each light source has a top surface and a bottom surface opposite the top surface; a first fan, for each light source, aligned with the top surface of the light source for supplying air to the top surface, wherein a first speed of the first fan operates is variable; a second fan, for each light source, aligned with the bottom surface of the light source for supplying air to the bottom surface, wherein a second speed of the second fan is variable; and control circuitry adapted to adjust the first speed of the first fan to supply air to the top surface of the light source and adjust the second speed of the second fan to supply air to the bottom surface of the light source to reduce the temperature difference between the top surface of the light source and bottom surface of the light source.

A better understanding of the nature and advantages of the present invention may be gained with reference to the following detailed description and the accompanying drawings.

BRIEF DESCRIPTION OF THE DRAWINGS

FIG. 4 illustrates an exemplary method of asymmetrical lamp cooling according to embodiments of the invention.

DETAILED DESCRIPTION OF THE INVENTION

Embodiments of the invention relate to asymmetrical cooling methods and systems for a projector assembly. Projector assemblies typically comprise light assemblies using high wattage light sources, such as high wattage UHP light bulbs. High wattage light bulbs generate a significant amount of heat to emit enough light for the projector to operate successfully. The heat generated by the high wattage light bulbs may lead to overheating of the light assembly and the projector, when a maximum threshold temperature is reached, or when consistently used at a temperature outside of an operating temperature range for the projector. Overheating of the projector causes damage to the light assemblies, light sources, projector, thus decreasing productivity, performance, reliability, and product longevity.

Additionally, because of natural convection, there are differences in the temperature of the gas at the top of the light bulb than the gas at the bottom of the light bulb, since the gas at the top of the light bulb will be significantly hotter than the gas at the bottom of the light bulb. Thus, providing a single, symmetric supply of air to the light source of a projector to cool the light bulb is also insufficient, as a temperature difference between the top and the bottom of the light bulb will still occur. Even with a constant supply of air through a fan or other means, natural convection will still cause heated gas to rise to the top of the light bulb. The temperature differences between the top and the bottom of the light bulb also cause damage to the light bulb and reduce its longevity, thus a consistent temperature needs to be maintained within the light source for optimal performance and product lifespan. Embodiments of the invention minimize the temperature differences that occur in light assemblies of projectors using high wattage light bulbs. Temperature differences between the top of the light bulb and the bottom of the light bulb are minimized by asymmetrical cooling systems and methods according to embodiments of the invention.

Figure 1:
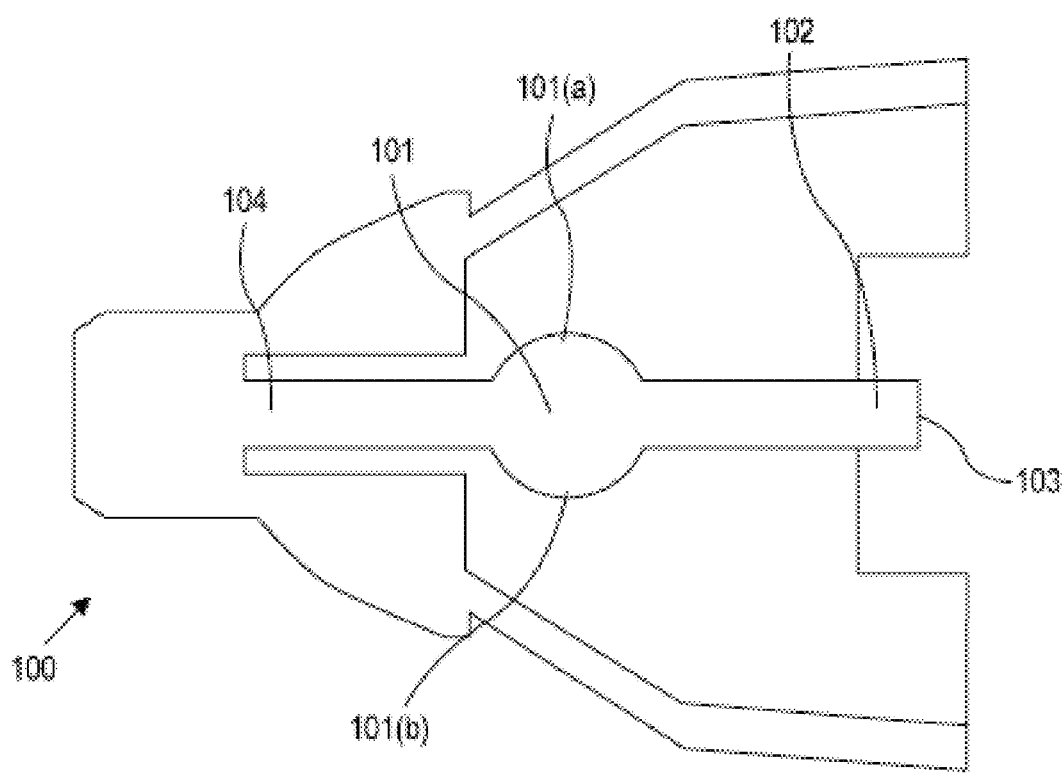
FIG. 1 shows an exemplary light source according to embodiments of the invention.

FIG. 1 shows an exemplary light assembly 100 according to embodiments of the invention. The light assembly 100 may have a light source 101 (e.g., bulb), with a top surface 101(a), and a bottom surface 101(b). The light source 101 may also have a front portion 102, a tip portion 103, and a rear portion 104. The rear portion 104 may couple to a housing or other means to enable electrical coupling from an electrical source to generate light. Light is emitted through the light source 101 (e.g., bulb), reflect by a reflector as a parabolic or elliptical part of the light assembly, and shone through the front portion 201, which may be comprised of glass, or other transparent material with high heat tolerance. The tip portion 103 may be comprised of metal or metal alloy.

The light source 101 (e.g., bulb) may have an operational temperature range, including a minimum threshold temperature for the bulb, $T_{b,min}$, and a maximum threshold temperature for the bulb, $T_{b,max}$. A temperature may be measured at the bulb top 101(a), and may be maintained below $T_{b,max}$ for the light source 101 to remain in the operational temperature range. A temperature measured at the bulb bottom 101(b) may be maintained above $T_{b,min}$. The front portion 102 may also have a measured front temperature and also may be maintained below a maximum threshold temperature for the front 102, $T_{f,max}$, for the light source 101 to remain in the operational temperature range. A temperature measured at the rear portion 104 may be maintained below a maximum threshold temperature for the rear 104, $T_{r,max}$. There may also be a maximum threshold temperature for the tip portion 103 of the bulb, $T_{t,max}$. A measured tip 103 temperature may be maintained below $T_{t,max}$ in order for the bulb to remain in optimal operation. Minimizing the temperature difference between the bulb top and the bulb bottom, and maintaining the measured temperatures of the bulb top, bulb bottom, front portion, tip portion, and rear portion to be within the operational temperature range of the light source, may reduce damage to the bulb, prolong bulb life, and optimize bulb performance. The operational temperature range may be defined by the minimum and maximum temperature thresholds, $T_{b,min}$, $T_{b,max}$, $T_{t,max}$, $T_{f,max}$, and $T_{r,max}$.

The projector assembly may include a device to measure temperature. As examples, the temperature measuring device may determine an ambient temperature of the light assembly, or an ambient temperature of the projector assembly. Other temperatures of specific areas of the light assembly or light source may also be measured.

In high wattage light bulbs typically used in projectors, it can be a challenge to minimize the temperature difference between the bulb top 101(a) and the bulb bottom 101(b) because $T_{b,min}$ is often close to $T_{b,max}$. The operating temperature range for such bulbs is narrow, therefore the light assembly 100 may include control circuitry to maintain and adjust temperatures within the light assembly 100 and around the light source 101.

Figure 2:
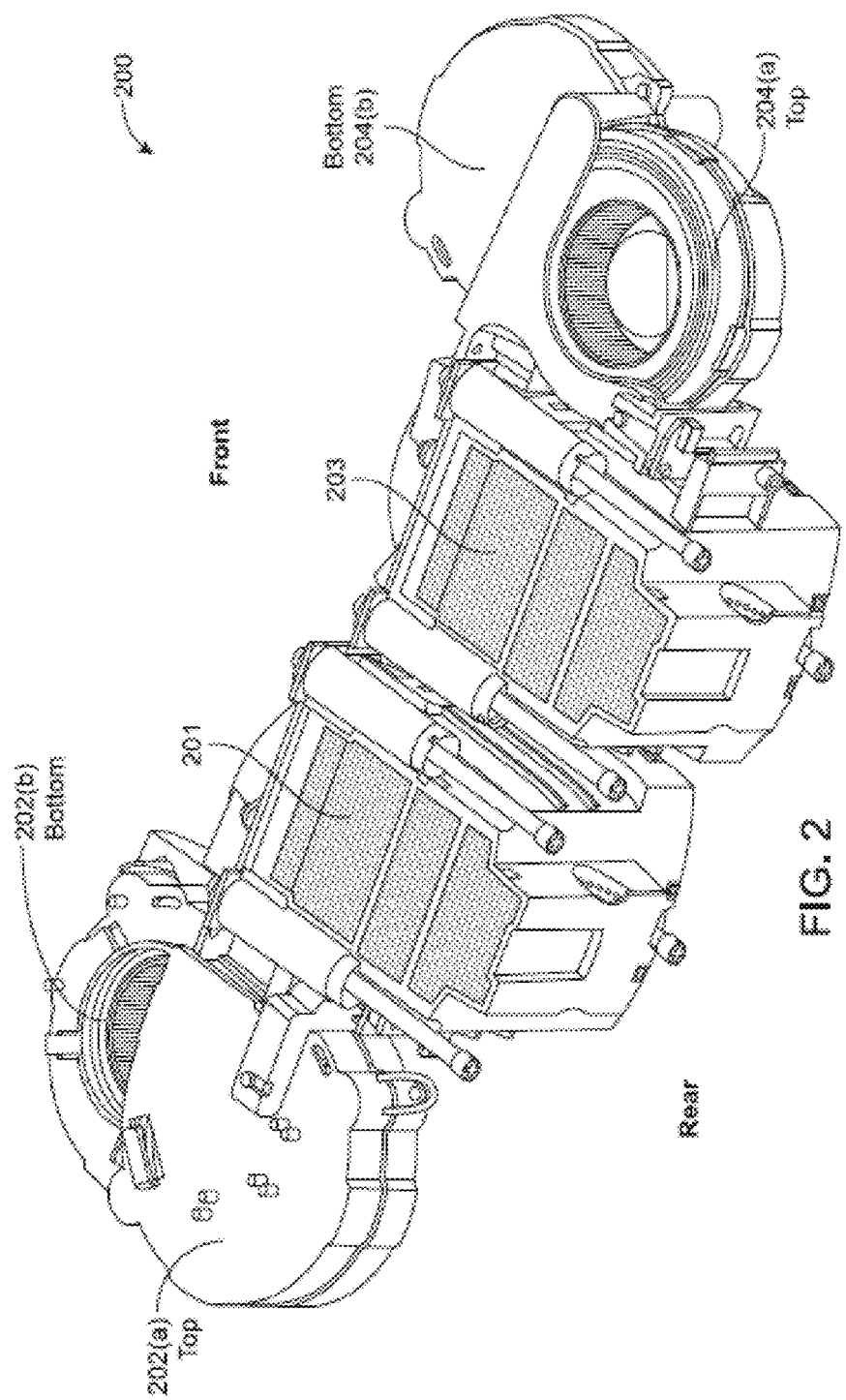
FIG. 2 shows an exemplary projector assembly according to embodiments of the invention.

FIG. 2 shows an exemplary projector assembly 200 having two light assemblies 201 and 203 according to embodiments of the invention. Each light assembly includes a light source, and the light assemblies are arranged horizontally adjacent to each other when the projector lies flat. The light assemblies may be surrounded by a housing for each assembly, including lamp ducts, as shown in FIG. 2. A pair of fans, a top fan and bottom fan, are arranged vertically on top of each other on the side of each light assembly, and may include fan ducts. For example, light assembly 203 may have an upper fan 204(a) and a lower fan 204(b) adjacent to the light assembly 203 on a side opposite from the side adjacent to light assembly 201. Light assembly 201 may have its own upper fan 202(a) and lower fan 202(b) on a side opposite from the side adjacent to light assembly 203.

Figure 3:
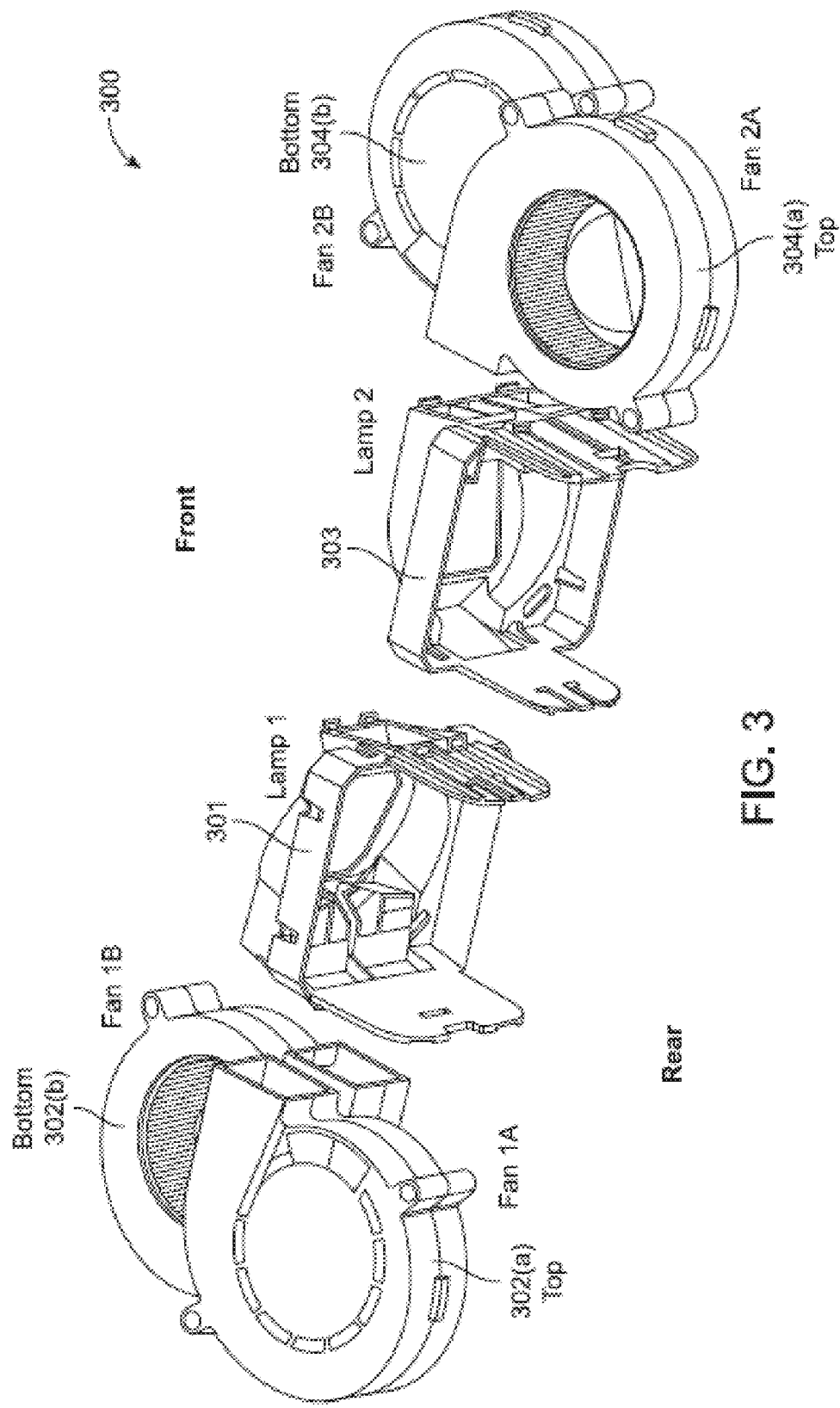
FIG. 3 shows an exemplary projector assembly according to embodiments of the invention.

FIG. 3 shows another exemplary projector assembly 300 according to embodiments of the invention. A light assembly (not shown), including a lamp shield 301, may be adjacent to a pair of fans arranged vertically to one another, including an air guide. The pair of fans may include a top fan 302(a) and a bottom fan 302(b), on one side of the light assembly of corresponding lamp shield 301. On an opposite side of the light assembly to corresponding lamp shield 301, there may be another light assembly (not shown), including its corresponding lamp shield 303, placed adjacently. Light assembly and corresponding lamp shield 303 may be adjacent to another pair of fans arranged vertically to one another, including a top fan 304(a) and a bottom fan 304(b), and air guide.

Air from both fans enter the light assembly from a side opposite the side adjacent to the other light assembly, wherein some embodiments of the invention, the upper fan always supplies more air than the bottom fan to the light source. More air from the upper fan than from the lower one minimizes the temperature differences between light source top and bottom, by cooling the top of the light source more than the bottom. The light source may have an operational temperature range, including a minimum threshold temperature and a maximum threshold temperature. The upper fan operates at a variable speed, which may be adjusted by control circuitry. Adjusting the speed of the upper fan maintains a temperature of the top of the light source and prevents the temperature from exceeding the maximum temperature threshold for the light source. Some air from the lower fan keeps a temperature of the bottom of the light source above the minimum temperature threshold for the light source, and also keeps the lower fan and the lower fan duct from over heating. Embodiments can include a physical partition between the light assemblies to ensure that air leaving one light assembly does not enter the second light assembly.

Projector assemblies may have multiple configurations and mounting variations for a projector's particular use. For example, an overhead projector or slide projector is typically desktop-mounted so that slides, film, and transparencies may be accessed by a user, whereas a video projector may be desktop-mounted or ceiling-mounted and connected to a DVD player through a cable. Embodiments of the invention provide cooling systems for multiple configurations and mounting variations.

FIGS. 4(a) and 4(b) illustrate air flow in projector assemblies according to embodiments of the invention. FIG. 4(a) illustrates air flow in a desktop-mounted projector assembly 400(a), as shown by the y-z axis. For each lamp, Lamp 1 as shown by 401 on the left and Lamp 2 as shown by 403 on the right, air from the two fans, represented by the arrows, enter the lamp in parallel when seen in a direction of the optical axis. Air flow from Fan 2A shown by 404(a) is provided to the top of Lamp 2 shown by 403. Fan 2B provides air flow 404(b) to the bottom of Lamp 2 shown by 403. In Lamp 1, 401, air provided by Fan 1A is represented by arrow 402(a) to the top of Lamp 1, and air provided by Fan 1B is represented by arrow 402(b) to the bottom of Lamp 2. The fan arrow sizes reflect the qualitative amount of cooling air applied from each fan, thus more air is provided to the top of the lamps as shown in 402(a) and 404(a), relative to the air provided to the bottom of the lamps shown in 402(b) and 404(b).

When the projector is turned for ceiling-mounted configuration as shown in FIG. 4(b), the fans switch roles, and arrangement of Lamp 1, 401, and Lamp 2, 403, are reversed from FIG. 4(a). In the ceiling-mounted projector assembly 400(b), Lamp 2, 403, is now on the left, and Lamp 1, 401 is now on the right. Air flow from Fan 1B shown by the arrow 402(b) provides air to the top of Lamp 1, 401, is now qualitatively larger than air flow from Fan 1A shown by arrow 402(a) providing air to the bottom of Lamp 1, 401. Similarly, air flow from Fan 2B shown by the arrow 404(b) provides air to the top of Lamp 2, 403, is now qualitatively larger than air flow from Fan 2A shown by arrow 404(a) providing air to the bottom of Lamp 2, 403.

Figure 10:
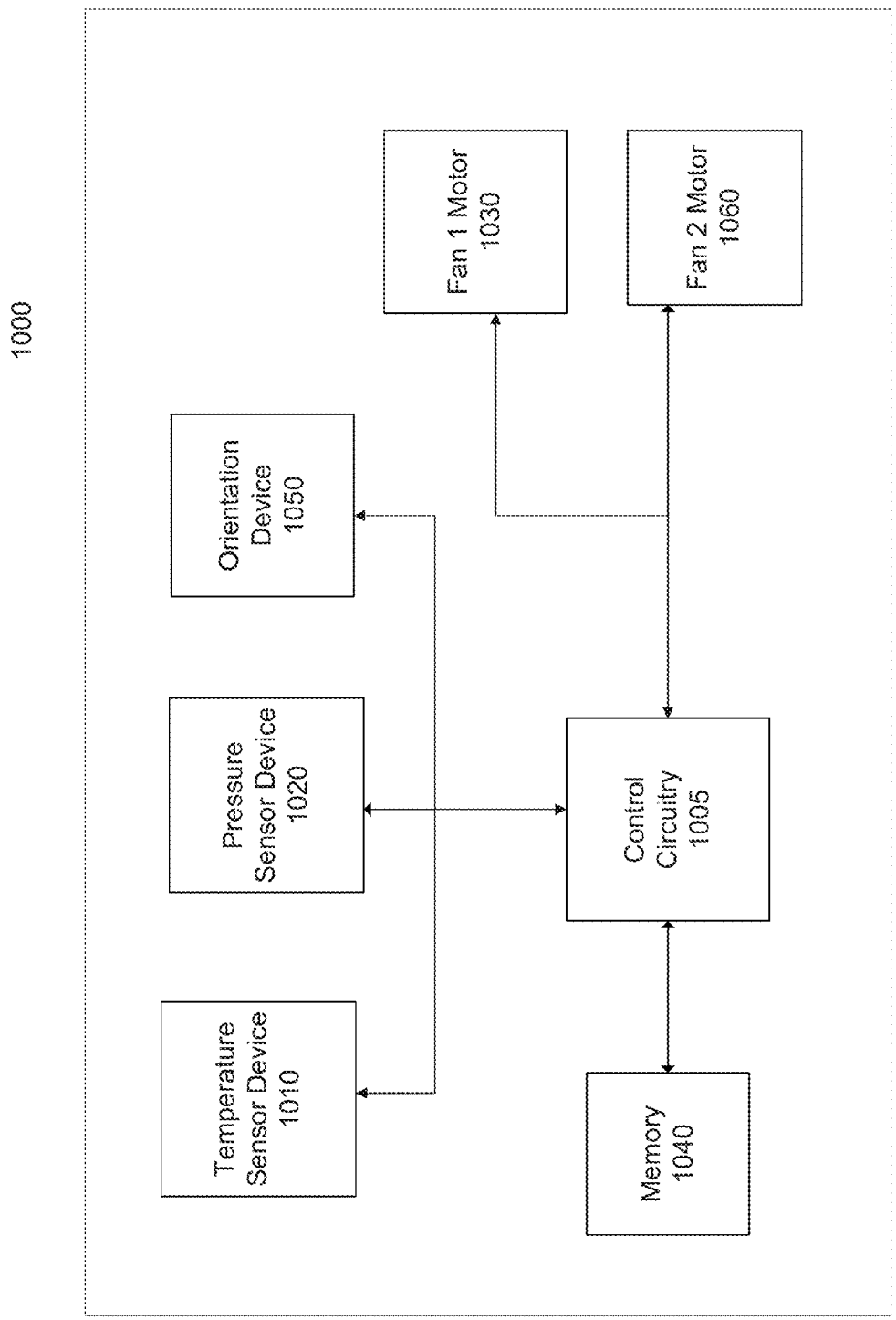
FIG. 10 shows a block diagram of an example control circuitry according to an embodiment of the invention.

The fans do not move relative to the lamps, but in some embodiments, the projector orientation is determined by an orientation device, and the fan speeds are set accordingly by control circuitry, with different speeds for different orientations. FIG. 10 shows a block diagram of electrical components of a projector 1000. The control circuitry 1005 may adjust the fan speeds for each fan using fan speed motors 1030 and 1060 based on a measured ambient temperature using temperature sensor device 1010. A fan speed motor may be any device that drives the fans, and which operate at a variable speed. Thus, the control circuitry 1005 may provide commands (e.g., a voltage or a digital command) to the fan speed motors 1030 and 1060 so that a desired speed may be achieved. Some intermediate projector orientations are accommodated by intermediate fan settings stored in a memory 1040 coupled to the control circuitry 1005 in the projector assembly. An orientation device 1050 may determine the orientation of the projector assembly, determining which side is the top and which side is the bottom, for example, when the projector assembly is desktop-mounted or ceiling-mounted. In some embodiments, the configuration (e.g., desktop-mount or ceiling-mount) may be selected by the user through a user interface (not shown).

Figure 5:
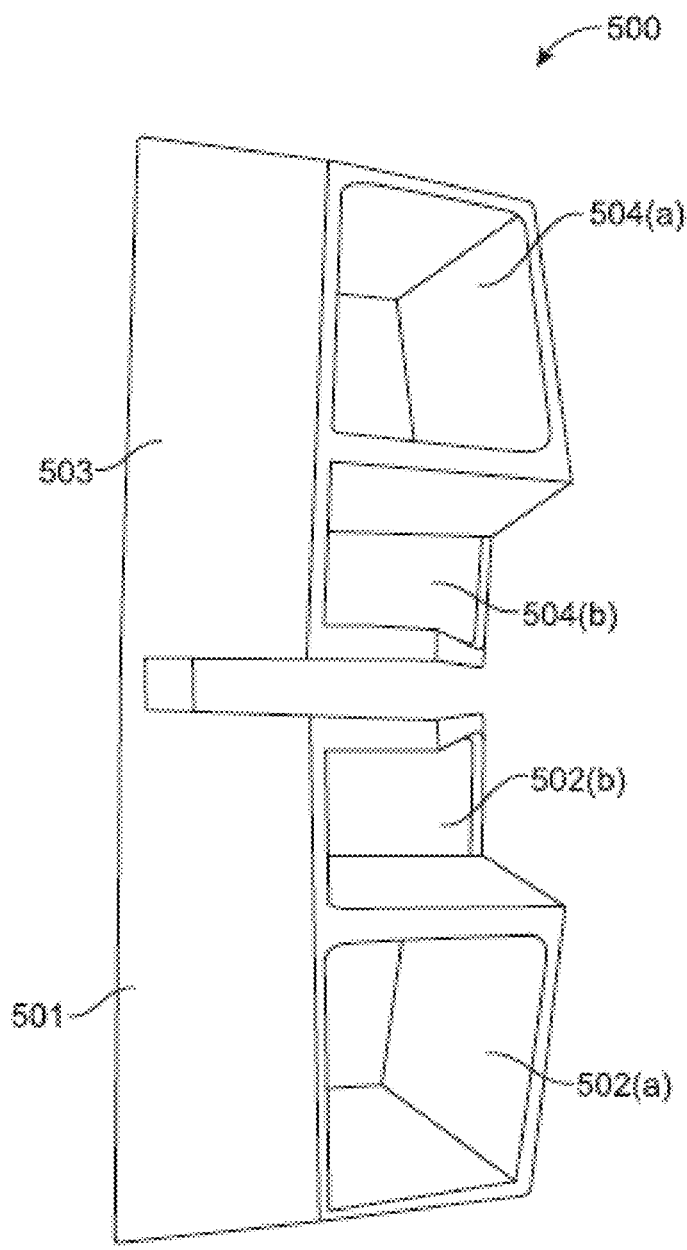
FIG. 5 shows an exemplary air guide according to embodiments of the invention.

The projector assembly may comprise an air guide for each light assembly to direct air from the pair of fans to targeted portions of the light assembly and its light source. An example air guide 500 is shown in FIG. 5. Air guide may be made of a die cast zinc alloy, or other suitable metal or material. Air from each fan are divided into one part towards top and bottom of the light source and one part towards the front and tip of the light source. The air guide may be comprised of two sections, each section with two ducts to direct air from each fan. For example, section 503 comprises ducts 504(a) and 504(b) to direct air from one of the fans in the pair of fans. Section 501 comprises ducts 502(a) and 502(b) to direct air from the other fan in the pair of fans. Larger ducts 504(A) and 502(a) allow more air to be directed to either the top of the bottom of the light source, depending on which section is for which fan. For example, if section 503 is aligned with the top fan, then duct 504(a) directs air to the top of the light source, and section 501 is aligned with the bottom fan, then duct 502(a) directs air to the bottom of the light source. Smaller ducts 502(a) and 504(b) direct air to the front and tip portions of the light source.

Figure 9C:
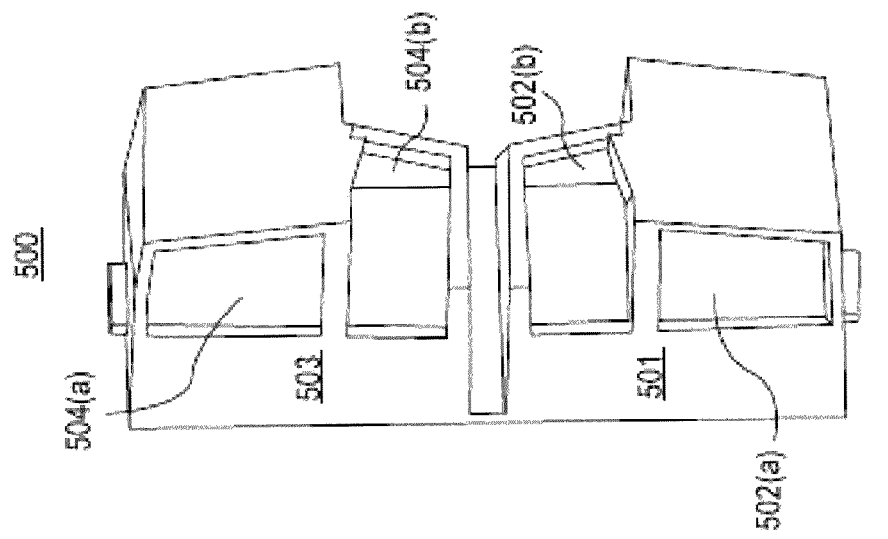
FIGS. 9(a)-9(c) show different perspective views of an exemplary air guide according to embodiments of the invention.
Figure 9B:
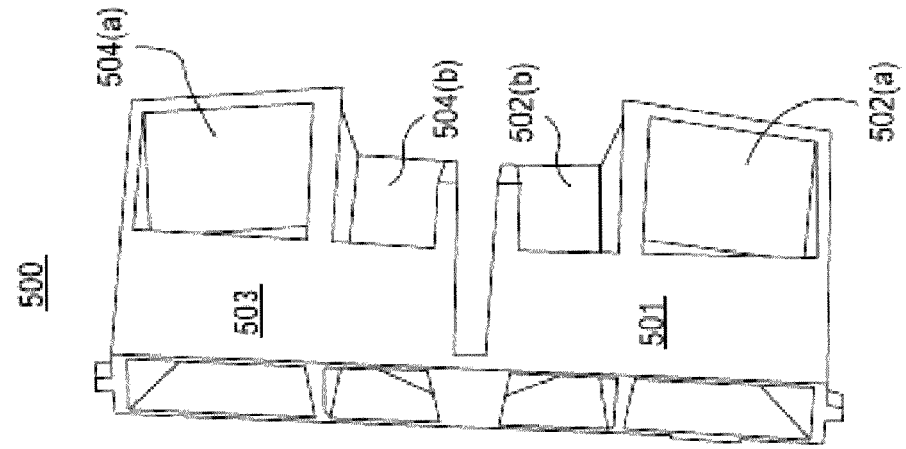
Figure 9A:
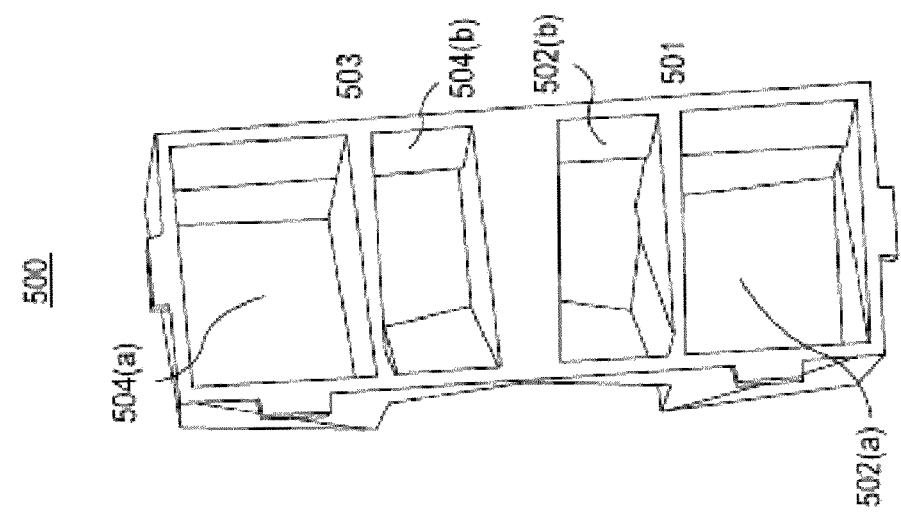

FIGS. 9(a)-9(c) show multiple perspectives of example air guides according to embodiments of the invention. In FIG.

Figure 6:
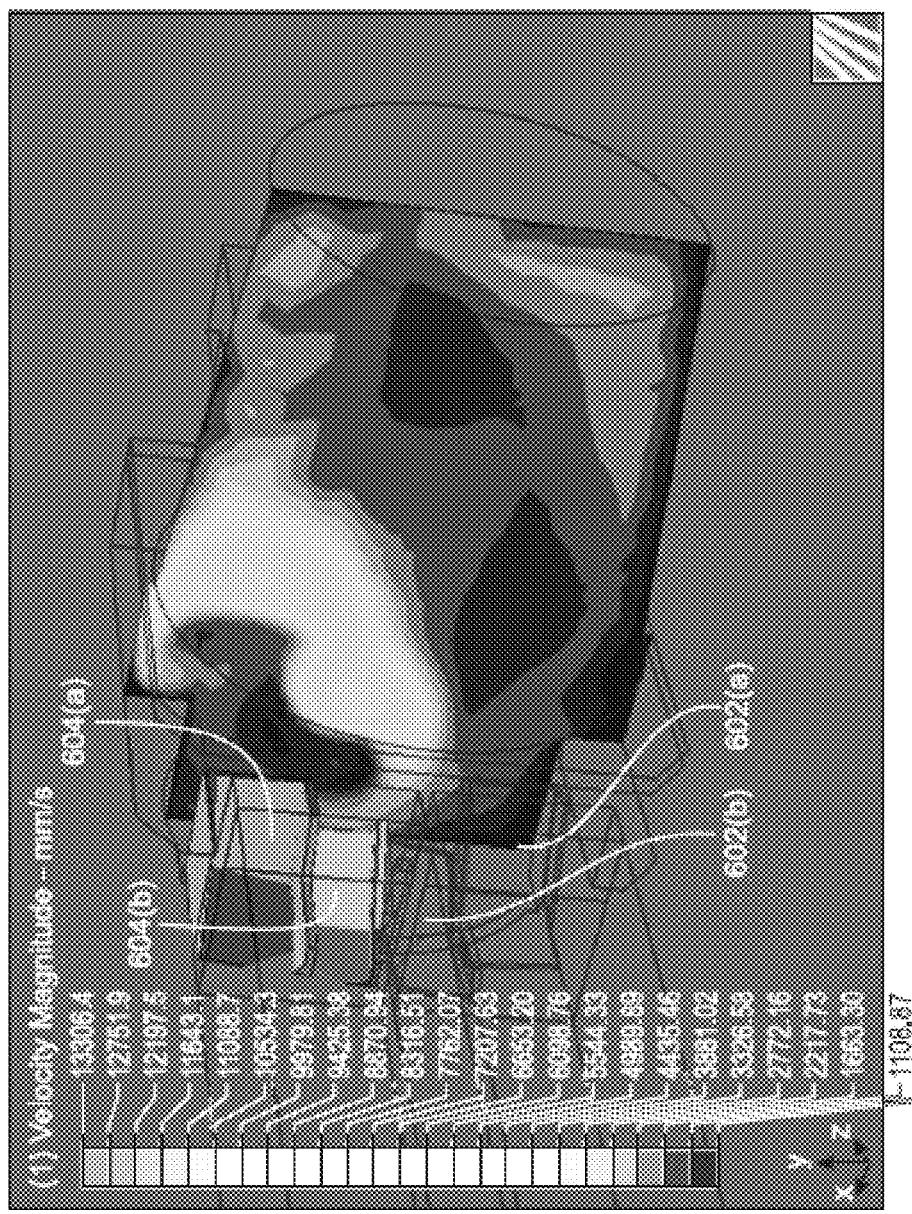
FIG. 6 illustrates air velocity through a projector assembly according to embodiments of the invention.

9(a), air enters into the drawing plane, with air going to the bulb at the top and bottom and to the front and tip in the middle. In FIG. 9(b), the air guide is rotated, so air enters from the left, and leaves out of the drawing plane towards the viewer, again with bulb air at the top and bottom, and front/tip air in the middle. In FIG. 9(c), the air guide is rotated further, almost 180° relative to FIG. 9(a), so air enters the air guide towards the viewer, and leaves for the lamp towards the viewer and to the left. Different angles of the ducts allows for accurate directing of the air to its targeted portion of the light source for cooling The air from both fans combine to give good temperature margins for the front and tip temperatures, and minimize temperature differences between the top and bottom of the light bulb FIG. 6 shows air velocity through a plane in the middle of the light assembly (e.g., lamp) when only the upper (e.g., top) fan is run to visualize the air flow from the air guides. Air from the light source (e.g., bulb) part of the air guide (604(a) and 602(a)) flows deeper into the light assembly than air from the front and tip portion of the air guide (604(b) and 602(b)).

Figure 7:
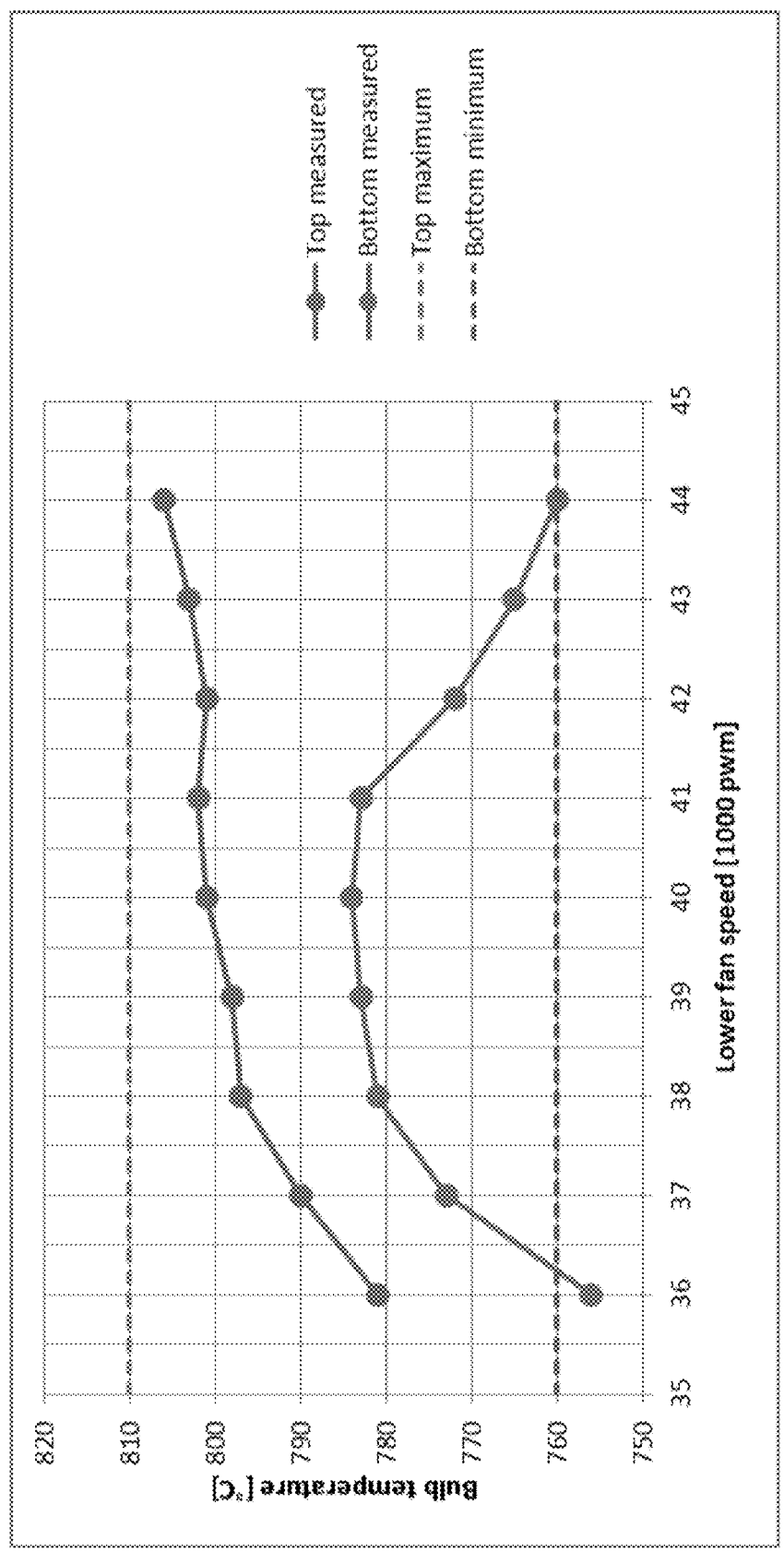
FIG. 7 illustrates temperature differences of different parts of a light source varying as a function of a fan speed according to embodiments of the invention.

FIG. 7 shows how the bulb top and bottom temperatures can vary with bottom fan speed. The results are shown for a particular test lamp at one particular top fan speed. The bottom fan speed is expressed as fan control signal, a number which can be varied between 20 000 (minimum speed) and 65 535 (maximum speed). The test is repeated for different top fan speeds and different test lamps, to establish fan speed combinations that give the right temperatures at different ambient conditions. Due to projector geometry, different fan speeds are optimal for the two lamps, for both desktop and ceiling projector orientation, according to embodiments of the invention.

As seen in FIG. 7, when the top fan is run at a fixed speed, and the bottom fan speed is gradually increased from 0, initially at very low bottom fan speeds, the bulb temperatures are not dependent on the bottom fan speed. Then as the bottom fan speed is increased, air from the bottom fan inhibits air from the top fan in cooling the bulb, and both bulb and top and bottom temperatures increase. Then at an intermediate level, the bulb temperatures plateau and are only weakly influenced by the bottom fan speed. At higher bottom fan speeds, when the fan speeds are of similar magnitude, air from the bottom fan cools the bulb bottom effectively, while inhibiting air from the top fan in cooling the bulb top. Thus, increasing the bottom fan speed now decreases the bulb bottom temperature and increases the bulb top temperature.

Figure 8:
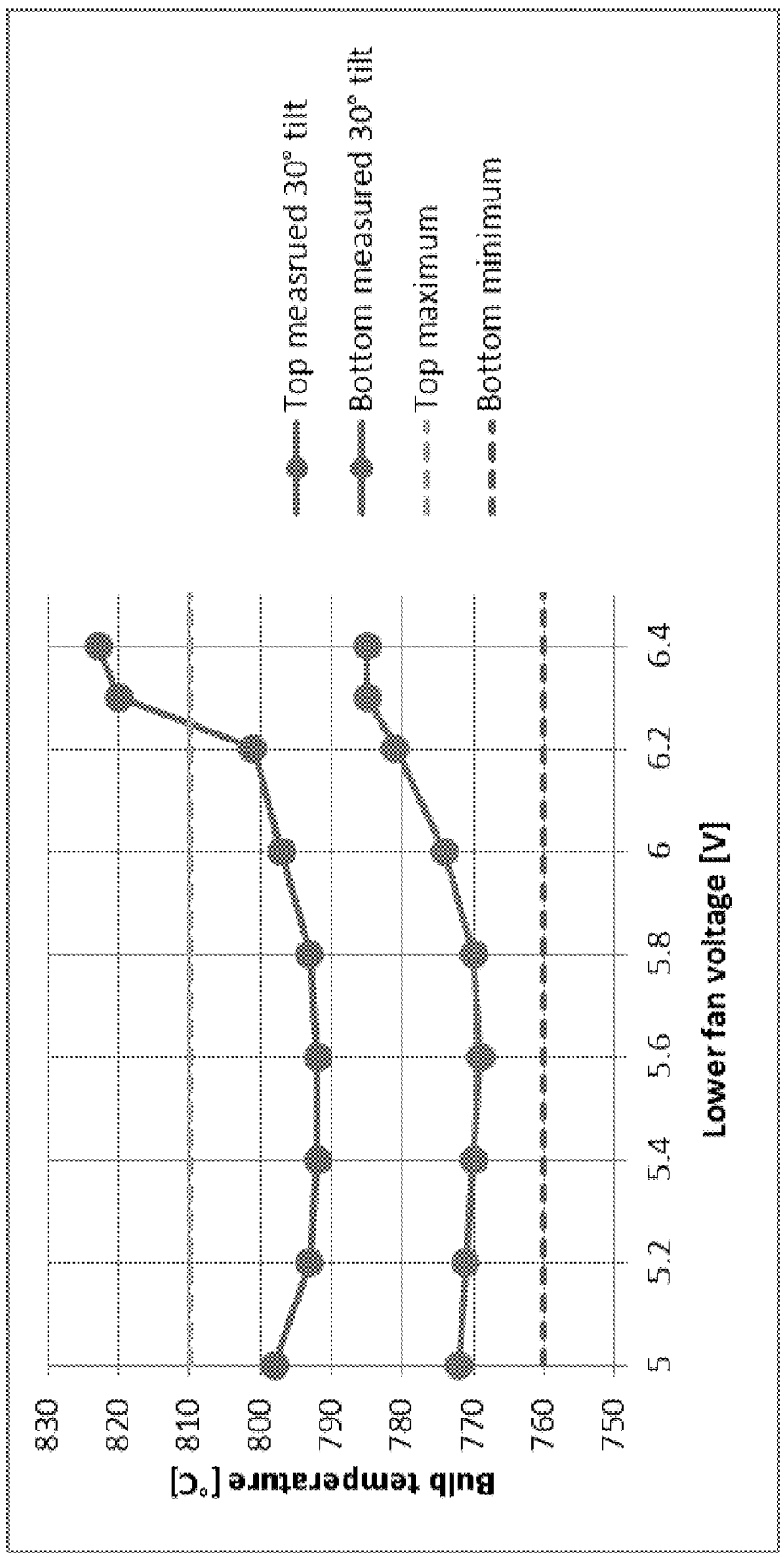
FIG. 8 illustrates temperature differences of different parts of a light source tilted 30 degrees varying as a function of a fan voltage according to embodiments of the invention.

In other embodiments of the invention, a projector assembly may be tilted to operate at an angle of inclination. For example, a projector assembly that is desktop-mounted may be tilted at an angle to project an image on a screen or a wall. FIG. 8 shows results measuring light source (e.g., bulb) temperature at a tilt with an angle of inclination of 30°. A fan speed may be set by fan voltage, which can be varied between 5V and 12V. Projector assemblies according to embodiments of the invention can accommodate an angle of inclination, for example, up to 30°, by only adjusting fan speeds, without altering physical configurations or moving parts, thus reducing potential hardware changes.

Projectors according to embodiments of the invention may set at least one fan speed based on measured inlet temperature. Cooling systems can have one fan aiming air at the bulb top, and one aiming air at the bulb bottom, but these are placed opposite each other (i.e., left and right of the lamp, when seen in the direction of the light). However, such a configuration increases a size of the projector. According to embodiments of the invention, the fans are placed above each other to effectively cool hotter gas rising to the top of the bulb and minimize temperature differences between the top of the bulb and the bottom of the bulb.

The projector assembly may include a pressure measuring device to determine an altitude at which the projector assembly is operating. Fan speeds based on lamp temperatures may vary for ambient conditions ranging from 10° C. to 40° C., and from 0 to 3000 meters above sea level.

In another embodiment of the invention, a calibration tables based on ambient temperature for the pair of fans may be used to determine fan speed settings. Fan speed settings may be stored in a memory coupled to control circuitry in the projector assembly. Calibration tables may be stored in the memory 1040 coupled to the example control circuitry 1005 in FIG. 10. The control circuitry 1005 shown in FIG. 10 may adjust the fan speeds for each fan using fan speed devices 1030 and 1060 based on a measured ambient temperature using temperature sensor device 1100. The orientation device 1050 may determine whether the projector assembly is desktop-mounted or ceiling-mounted. Some intermediate projector orientations are accommodated by intermediate fan settings stored in a memory 1040 coupled to the control circuitry 1005 in the projector assembly. Data in the calibration tables stored in memory 1040 may be obtained by actively measuring temperatures in a test device with temperature sensor device(s) 1010 for different ambient temperatures and pressures, with a pressure sensor device 1020, as described below. Calibration tables may specify the speeds for each fan for any combination of one or more of the following measured data points: temperature, pressure, angle of inclination, and/or orientation. The control circuitry uses one of the measured data points, for example, a measured ambient temperature, to access the calibration table to determine an appropriate fan speed for each fan based on the measured ambient temperature. The calibration table may also be indexed by a measured ambient temperature, as well as other measured data points, such as pressure, to more accurately determine an appropriate fan speed for each fan.

Measuring the bulb temperature accurately requires special lamps with holes, and the use of IR cameras. Alternatively, thermocouples give inaccurate temperature measurements. Both methods reduce the light output from the lamps, and as a consequence also the projector performance. In another embodiment, a projector assembly may comprise a temperature measuring device capable of continuous temperature measurements of the lamp bulbs.

In another embodiment of the invention, other sensor devices may be used to measure ambient conditions, other than temperature and pressure. Other ambient conditions may be used and included in fan tables to determine the corresponding fan speeds for the fans to properly and asymmetrically cool the lamp assembly.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A projector assembly comprising:
   a first light assembly having a top surface, a bottom surface, a first surface, and a second surface opposite the first surface, the first light assembly including a first light source;
   a second light assembly having a top surface, a bottom surface, a first surface, and a second surface opposite the first surface, the second light assembly including a second light source, wherein the first surface of the first light assembly is adjacent to the second surface of the second light assembly, wherein each light source has a top surface and a bottom surface opposite the top surface;

a first fan of a pair of fans for each light source, the first fan aligned with the top surface of the light source for supplying air to the top surface, wherein a first speed of the first fan is variable;

a second fan of the pair of fans for each light source, the second fan aligned with the bottom surface of the light source element for supplying air to the bottom surface, wherein a second speed of the second fan is variable;

a temperature measuring device adapted to determine an ambient temperature; and control circuitry adapted to adjust the first speed of the first fan and the second speed of the second fan based on the measured ambient temperature to reduce a temperature difference between the top surface of each light source and bottom surface of each light source.

2. The projector assembly of claim 1, wherein the control circuitry is coupled with a memory that stores a setting of each fan based on an ambient temperature.

3. The projector assembly of claim 1, further comprising: an orientation device for determining an orientation of the light source, thereby determining which surface of the light source is the top surface and which surface of the light source is the bottom surface.

4. The projector assembly of claim 1, further comprising: a device for measuring pressure, wherein the control circuitry is adapted to adjust the fans speeds based on the pressure measured.

5. The projector assembly of claim 1, further comprising: a device for determining an angle of inclination of the projector assembly, wherein the control circuitry is adapted to adjust the fans speeds based on the angle of inclination measured.

6. The projector assembly of claim 1, wherein the first speed of the first fan is operable to be increased when a temperature of the top surface of the light source is higher than a temperature of the bottom surface of the light source.

7. The projector assembly of claim 6, wherein the second speed of the second fan is decreased when the temperature of the top surface of the light source is higher than the temperature of the bottom surface of the light source.

8. The projector assembly of claim 1, wherein the first speed of the first fan is operable to be decreased when a temperature of the top surface of the light source is lower than a temperature of the bottom surface of the light source.

9. The projector assembly of claim 8, wherein the second speed of the second fan is increased when a temperature of the top surface of the light source is lower than a temperature of the bottom surface of the light source.

10. The projector assembly of claim 1, wherein the first speed of the first fan is always faster than the second speed of the second fan.

11. The projector assembly of claim 1, further comprising an air guide for each fan, wherein the air guide comprises a first duct to provide air flow to either the top surface or the bottom surface of the light source, and a second duct to provide air flow to a front surface of the light source.

12. The projector assembly of claim 11, wherein first duct is configured to supply more air to the top surface or bottom surface of the light source than the second duct supplying air to the front surface of the light source.

13. The projector assembly of claim 11, wherein the first duct is at an angle to direct air to the top surface or bottom surface of the light source, and the second duct is at an angle to direct air to the front surface of the light source.

14. A projector assembly comprising:

a first light assembly having a top surface, a bottom surface, a first surface, and a second surface opposite the first surface, the first light assembly including a first light source;

a second light assembly having a top surface, a bottom surface, a first surface, and a second surface opposite the first surface, the second light assembly including a second light source, wherein the first surface of the first light assembly is adjacent to the second surface of the second light assembly, wherein each light source has a top surface and a bottom surface opposite the top surface;

a first fan, for each light source, aligned with the top surface of the light source for supplying air to the top surface, wherein a first speed of the first fan operates is variable;

a second fan, for each light source, aligned with the bottom surface of the light source for supplying air to the bottom surface, wherein a second speed of the second fan is variable; and control circuitry adapted to adjust the first speed of the first fan to supply air to the top surface of the light source and adjust the second speed of the second fan to supply air to the bottom surface of the light source to reduce the temperature difference between the top surface of the light source and bottom surface of the light source.

15. The projector assembly of claim 14, further comprising an orientation device adapted to determine an orientation of the projector assembly, thereby determining which surface of the light source is the top surface and which surface of the light source is the bottom surface.

16. The projector assembly of claim 14, wherein the first speed of the first fan is always faster than the second speed of the second fan.

17. The projector assembly of claim 14, further comprising an air guide for each fan, wherein the air guide comprises a first duct to provide air flow to either the top surface or the bottom surface of the light source, and a second duct to provide air flow to a front surface of the light source.

18. A method for cooling a two-light projector assembly, comprising:

determining, by a temperature measuring device, an ambient temperature of the projector assembly;

communicating the measured ambient temperature to control circuitry;

determining, with the control circuitry, fans speeds for a pair of fans, the two-light assembly having a first pair of fans on one side of the two-light assembly, wherein the first pair of fans has a first fan for a top of a first light source and a second fan for a bottom of the first light source, the two-light assembly further having a second pair of fans on an opposite side of the two-light assembly, wherein the second pair of fans has a first fan for a top of a second light source and a second fan for a bottom of the second light source;

adjusting, via the control circuitry, a first speed for each of the two first fans to supply air to the top surfaces of both light sources; and adjusting, via the control circuitry, a second speed for each of the two second fans to supply air to the bottom surfaces of both light sources.

19. The method of claim 18, further comprising:

determining, by an orientation device, the orientation of the projector assembly; and determining which surface of the light source is the top surface and which surface of the light source is the bottom surface, thereby determining which fan in the pair of fans is the first fan and which fan is the second fan.

20. The method of claim 18, wherein the first speeds of each of the first fans is always faster than the second speeds of each of the second fans.

21. The method of claim 18, further comprising:
directing, using an air guide, more air flow to either the top surface or the bottom surface of the light source.

22. The method of claim 18, wherein the first speeds of each of the first fans and the second speeds of each of the second fans are variable.

* * * * *

UNITED STATES PATENT AND TRADEMARK OFFICE
CERTIFICATE OF CORRECTION

PATENT NO. : 8,882,276 B2
APPLICATION NO. : 13/412491
DATED : November 11, 2014
INVENTOR(S) : Nordgard-Hansen et al.

It is certified that error appears in the above-identified patent and that said Letters Patent is hereby corrected as shown below:

In the claims,

In Column 9, Claim 12, line 62, insert --the-- after "wherein;"

In Column 10, Claim 14, line 19, delete "operates."

Signed and Sealed this
Twenty-first Day of July, 2015

Michelle K. Lee
*Director of the United States Patent and Trademark Office*